(12) United States Patent
Murai et al.

(10) Patent No.: US 10,479,204 B2
(45) Date of Patent: Nov. 19, 2019

(54) FAILURE DETERMINATION APPARATUS AND METHOD FOR DETERMINING FAILURE

(71) Applicant: HONDA MOTOR CO., LTD., Tokyo (JP)

(72) Inventors: Naoko Murai, Wako (JP); Hidehiro Tsubokura, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 396 days.

(21) Appl. No.: 15/265,850

(22) Filed: Sep. 15, 2016

(65) Prior Publication Data

US 2017/0072803 A1 Mar. 16, 2017

(30) Foreign Application Priority Data

Sep. 15, 2015 (JP) ................. 2015-182068

(51) Int. Cl.
| | | |
|---|---|---|
| B60L 3/00 | (2019.01) | |
| G01R 31/396 | (2019.01) | |
| G01R 35/00 | (2006.01) | |
| H02J 7/00 | (2006.01) | |
| G01R 31/392 | (2019.01) | |

(Continued)

(52) U.S. Cl.
CPC ............ *B60L 3/0046* (2013.01); *B60L 58/16* (2019.02); *B60L 58/22* (2019.02); *G01R 31/392* (2019.01); *G01R 31/396* (2019.01); *G01R 35/00* (2013.01); *H02J 7/0014* (2013.01); *H02J 7/0026* (2013.01); *B60L 2240/545* (2013.01); *B60L 2240/547* (2013.01); *B60L 2240/549* (2013.01); *Y02T 10/7005* (2013.01); *Y02T 10/7055* (2013.01); *Y02T 10/7061* (2013.01)

(58) Field of Classification Search
CPC ... Y02T 10/7005; B60L 2200/00; G01R 1/00; G06N 3/00; G05B 1/00; G05B 2219/00; G06K 1/00; G06K 2207/00; G06F 1/00; G06F 2101/00
See application file for complete search history.

(56) References Cited

U.S. PATENT DOCUMENTS

2012/0290879 A1* 11/2012 Shibuya .................. G06N 20/00
714/26
2013/0103657 A1* 4/2013 Ikawa ............... G06F 16/90344
707/693

(Continued)

FOREIGN PATENT DOCUMENTS

| JP | 2007-020336 | 1/2007 |
|---|---|---|
| JP | 2008-008703 | 1/2008 |

OTHER PUBLICATIONS

Japanese Office Action for corresponding JP Application No. 2015-182068, dated Jul. 10, 2018 (w/ machine translation).

*Primary Examiner* — Huy Q Phan
*Assistant Examiner* — Temilade S Rhodes-Vivour
(74) *Attorney, Agent, or Firm* — Mori & Ward, LLP

(57) ABSTRACT

A failure determination apparatus includes an electricity storage, a state sensor, a data accumulator, and a controller. The state sensor is to detect a state of the electricity storage as data. The data accumulator is to accumulate the data acquired by the state sensor as accumulated data. The controller is to determine, based on the accumulated data, whether a failure occurs in at least one of the electricity storage and the state sensor.

6 Claims, 13 Drawing Sheets

(51) Int. Cl.
*B60L 58/16* (2019.01)
*B60L 58/22* (2019.01)

(56) References Cited

U.S. PATENT DOCUMENTS

| | | | | |
|---|---|---|---|---|
| 2013/0300449 | A1* | 11/2013 | Nakamura | H01L 31/02021 324/761.01 |
| 2014/0009090 | A1* | 1/2014 | Ashida | H02P 31/00 318/139 |
| 2014/0042973 | A1* | 2/2014 | Kawahara | H01M 10/441 320/118 |
| 2014/0175873 | A1* | 6/2014 | Kishimoto | H01M 10/441 307/10.1 |
| 2015/0100534 | A1* | 4/2015 | Ohtani | G06F 17/10 706/46 |
| 2015/0132615 | A1* | 5/2015 | Yun | H01M 10/486 429/50 |

\* cited by examiner

US 10,479,204 B2

FAILURE DETERMINATION APPARATUS AND METHOD FOR DETERMINING FAILURE

CROSS-REFERENCE TO RELATED APPLICATIONS

The present application claims priority under 35 U. S. C. § 119 to Japanese Patent Application No. 2015-182068, filed Sep. 15, 2015. The contents of this application are incorporated herein by reference in their entirety.

BACKGROUND

Field

The present invention relates to a failure determination apparatus and a method for determining failure.

Description of Related Art

Conventionally, there have been disclosed techniques of detecting deterioration (failure) of a battery based on the values of a current sensor or a voltage sensor connected to the battery. Specifically, the state of charge of the battery is detected using a current sensor or a voltage sensor. When the detected state of charge of the battery is equal to or greater than a first threshold value, the internal resistance of the battery is measured, and variations among a plurality of internal resistance values are measured. When the variations are equal to or greater than a second threshold value, it is determined that the battery has deteriorated. Thus, deterioration of the battery is detected (See Japanese Patent Application Publication No. 2008-8703).

SUMMARY

According to one aspect of the present invention, a failure determination apparatus for an electricity storage system includes an electricity storage unit, a state detecting unit for detecting a state of the electricity storage unit, an accumulating unit for accumulating data acquired by the state detecting unit, and a determining unit for determining, based on accumulation data acquired from the accumulating unit, whether there exists a failure of one of the electricity storage unit and the state detecting unit.

According to another aspect of the present invention, a failure determination apparatus includes an electricity storage, a state sensor, a data accumulator, and a controller. The state sensor is to detect a state of the electricity storage as data. The data accumulator is to accumulate the data acquired by the state sensor as accumulated data. The controller is to determine, based on the accumulated data, whether a failure occurs in at least one of the electricity storage and the state sensor.

According to still another aspect of the present invention, a failure determination apparatus includes an electricity storage, a state sensor, circuitry. The state sensor is to detect a state of the electricity storage as data. The circuitry is configured to accumulate the data acquired by the state sensor as accumulated data, and determine, based on the accumulated data, whether a failure occurs in at least one of the electricity storage and the state sensor.

According to further aspect of the present invention, in a method for determining failure, a state of an electricity storage is detected as data with a state sensor. The data is accumulated as accumulated data. Whether a failure occurs in at least one of the electricity storage and the state sensor is determined based on the accumulated data.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION OF THE EMBODIMENTS

Figure 1:
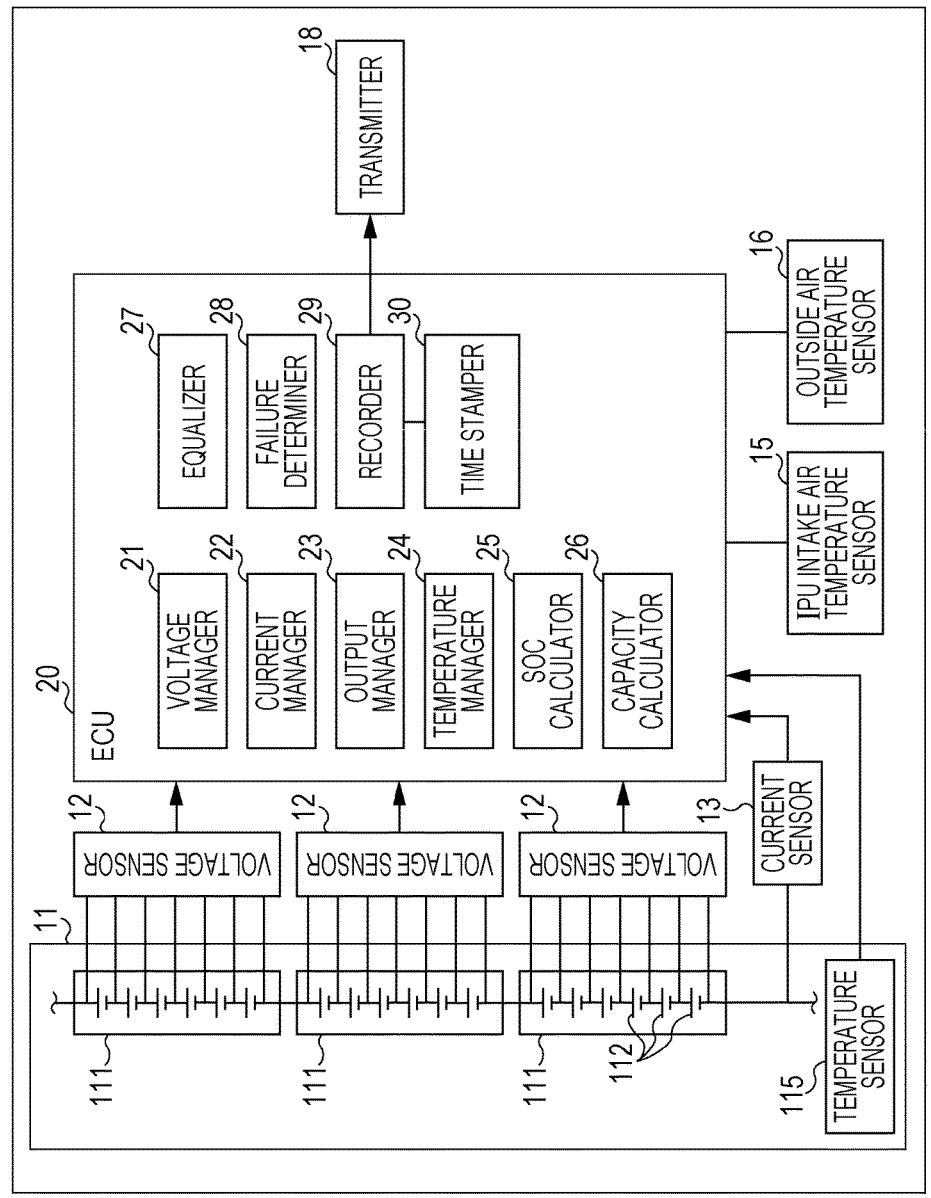
FIG. 1 is a block diagram showing a vehicle 1 equipped with a failure mode determination apparatus for an electricity storage system according to a first embodiment of the present invention.

The embodiments will now be described with reference to the accompanying drawings, wherein like reference numerals designate corresponding or identical elements throughout the various drawings.

First Embodiment

In the following, with reference to the drawings, a detailed description will be given of a first embodiment of the present invention. Note that, in a description of second and following embodiments, any structure being identical to that of the first embodiment is denoted by an identical reference character, and the description thereof will be omitted.

Figure 2:
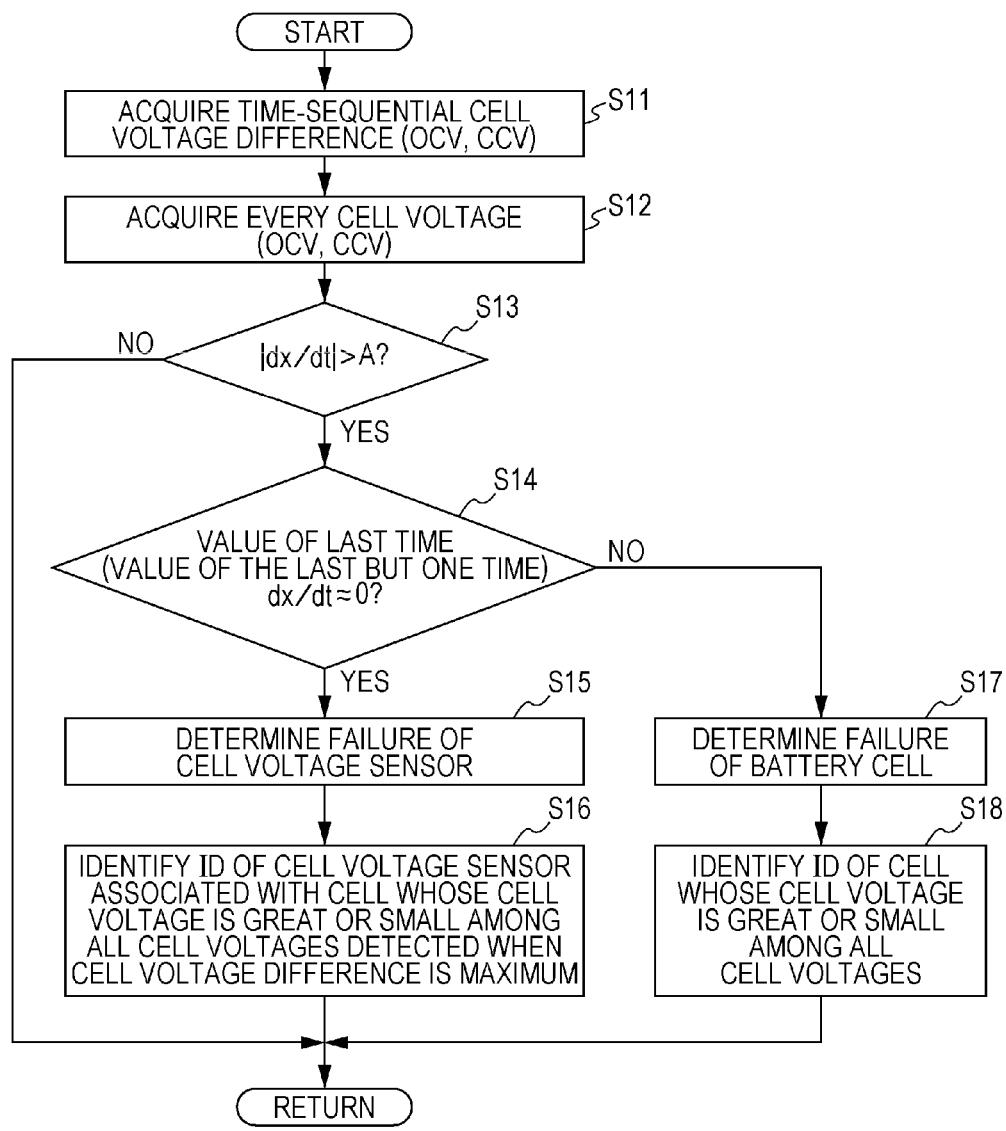
FIG. 2 is a flowchart showing a failure mode determining process in the failure mode determination apparatus for an electricity storage system according to the first embodiment of the present invention.
Figure 3:
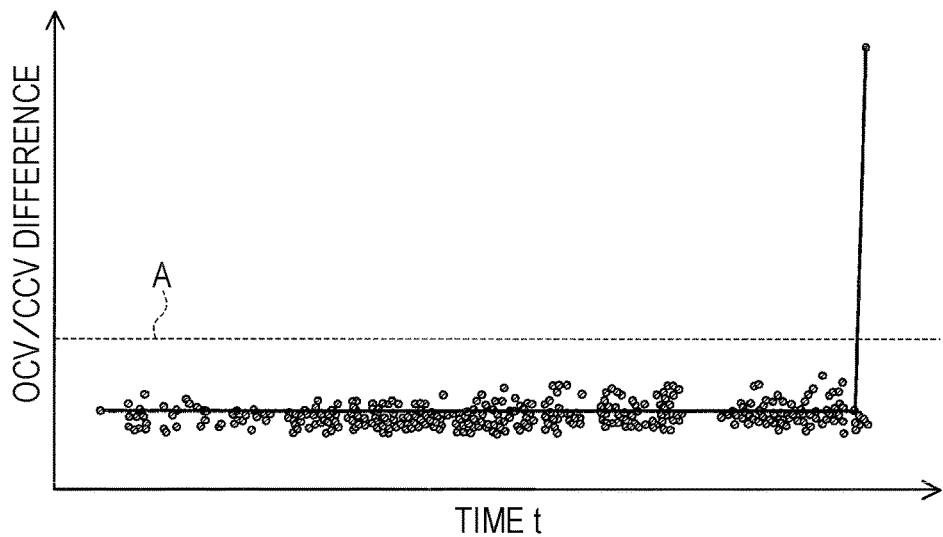
FIG. 3 is a graph showing the case where a failure of a voltage sensor is detected in the failure mode determination apparatus for an electricity storage system according to the first embodiment of the present invention.
Figure 4:
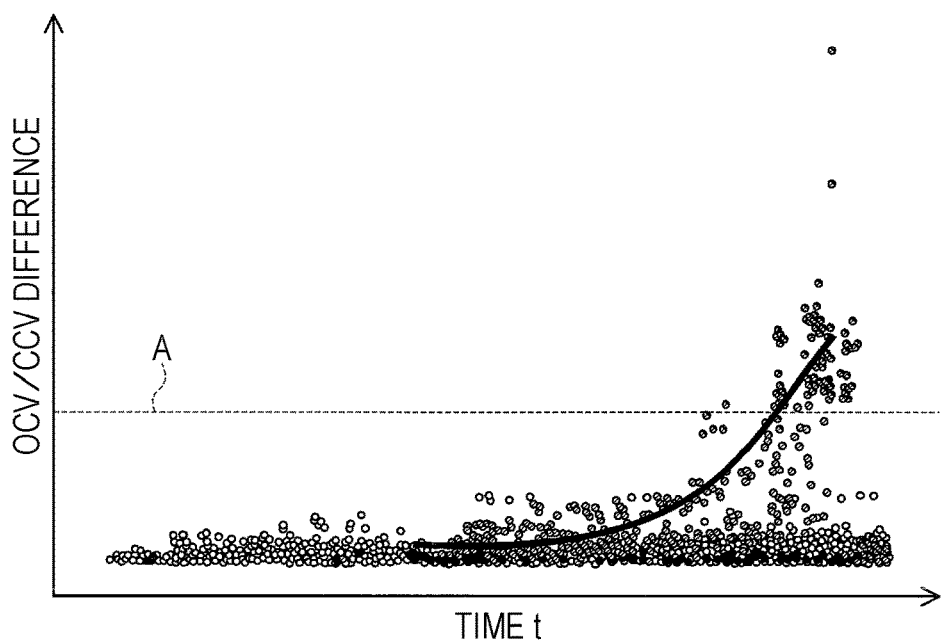
FIG. 4 is a graph showing the case where a failure of a cell of a battery pack 11 is detected in the failure mode determination apparatus for an electricity storage system according to the first embodiment of the present invention.

FIG. 1 is a block diagram showing a vehicle 1 equipped with a failure mode determination apparatus (a failure determination apparatus) for an electricity storage system according to the first embodiment of the present invention. FIG. 2 is a flowchart showing a failure mode determining process in the failure mode determination apparatus for an electricity storage system according to the first embodiment of the present invention. FIG. 3 is a graph showing the case where a failure of a voltage sensor is detected in the failure mode determination apparatus for an electricity storage system according to the first embodiment of the present invention. FIG. 4 is a graph showing the case where a failure of a cell 112 of a battery pack 11 is detected in the failure mode determination apparatus for an electricity storage system according to the first embodiment of the present invention.

The failure mode determination apparatus for an electricity storage system according to the first embodiment is installed in a vehicle 1, such as an electric vehicle or a hybrid vehicle, which is driven by electricity supplied from a battery pack 11 structuring the electricity storage system. As shown in FIG. 1, the electricity storage system installed in the vehicle 1 includes the battery pack 11 structured by assembled batteries. The battery pack 11 includes a plurality of electricity storage modules 111. The electricity storage module 111 includes a plurality of cells (electricity storage cells) 112 each being a secondary battery structured by a lithium-ion battery. The plurality of cells 112 are stacked and electrically connected in series. The battery pack 11 structures a high-voltage battery, and used as a storage battery of the electric vehicle or the hybrid vehicle.

The battery pack 11 as an electricity storage unit is provided with a temperature sensor 115. The temperature sensor 115 detects temperatures of all the cells 112 in the battery pack 11. Further, all the cells 112 are electrically connected to voltage sensors (hereinafter referred to as the "cell voltage sensors 12"). The cell voltage sensor 12 is provided for each electricity storage module 111. The cell voltage sensors 12 detect an open circuit voltage of every cell 112 in the battery pack 11, and a maximum cell voltage value and a minimum cell voltage value for every cell 112 in the battery pack 11. Further, a current sensor 13 capable of detecting current output from the battery pack 11 is provided.

Further, an IPU intake air temperature sensor 15 is further provided, which is capable of detecting temperatures of a coolant that is supplied for cooling the battery pack 11 housed in an IPU (a battery box). The IPU intake air temperature sensor 15 is disposed in an air intake duct having its one end opened in the cabin of the vehicle 1 and its other end opened toward the assembled batteries, and capable of detecting temperatures of intake air for the battery pack 11. Further, an outside air temperature sensor 16 capable of detecting temperatures outside the vehicle 1 is provided. The outside air temperature sensor 16 is provided outside the vehicle 1. The cell voltage sensors 12, the current sensor 13, the IPU intake air temperature sensor 15, the outside air temperature sensor 16, and the temperature sensor 115 are electrically connected to an ECU (Engine Control Unit) 20 via leads or wirings on a circuit board. The cell voltage sensor 12, the current sensor 13, the IPU intake air temperature sensor 15, and the temperature sensor 115 structure a state detecting unit (a state sensor) for detecting the state of the electricity storage unit.

Further, a transmitter 18 that externally transmits output of the ECU 20 is electrically connected to the ECU 20. Specifically, the transmitter 18 has a DSP (Digital Signal Processor) or the like, and is capable of wirelessly communicating with a server through a wireless communication network represented by a mobile phone network such as 3G or LTE. The transmitter 18 is capable of transmitting, to the server, information of a failure of any cell voltage sensor 12, information of a failure of any cell 112, and information of ID of the failed cell voltage sensor 12 or that of the failed cell 112. Further, the transmitter 18 is capable of transmitting, to the server, an identification number identifying the vehicle 1 (hereinafter referred to also as the "vehicle ID"), passwords, information on the current position of the vehicle, a request for facility information and the like.

The ECU 20 includes an input circuit for receiving input signal waveforms from the cell voltage sensor 12 and the like, a central processing unit (hereinafter referred to as the "CPU"), various operational programs executed in the CPU, various maps, a storage circuit that stores a first threshold value A to an eighth threshold value L which will be described later, an output circuit that outputs control signals and the like. With these elements, in the ECU 20, a voltage manager 21, a current manager 22, an output manager 23, a temperature manager 24, an SOC (State of Charge) calculator 25, a capacity calculator 26, an equalizer 27, a failure determiner 28, a recorder 29, and a time stamper 30 are structured.

The voltage manager 21 reads an open circuit voltage of every cell 112 detected by the cell voltage sensor 12. Further, the voltage manager 21 reads a maximum cell voltage value and a minimum cell voltage value for every cell 112 detected by cell voltage sensors 12, and calculates the difference between the maximum cell voltage value and the minimum cell voltage value (hereinafter referred to as the "voltage difference"). Further, the voltage manager 21 outputs open circuit voltage data and voltage difference data of every cell 112 to the output manager 23, the SOC calculator 25, the capacity calculator 26, the equalizer 27, the failure determiner 28, and the time stamper 30.

The current manager 22 reads current which is output from the battery pack 11 and detected by the current sensor 13. Further, the current manager 22 outputs data of the current that is output from the battery pack 11 and detected by the current sensor 13 to the output manager 23, the SOC calculator 25, the capacity calculator 26, the equalizer 27, the failure determiner 28, and the time stamper 30.

The output manager 23 manages instruction values of the current output from the battery pack 11, based on the open circuit voltage data from the voltage manager 21, the current data from the current manager 22, and SOC of every cell 112 from the SOC calculator 25.

The temperature manager 24 reads temperature data from the outside air temperature sensor 16, and manages the temperature of an engine coolant to be a substantially constant temperature. Further, the temperature manager 24 outputs the temperature data read from the IPU intake air temperature sensor 15 and the outside air temperature sensor 16 to the failure determiner 28 and the time stamper 30.

The SOC calculator 25 calculates SOC of every cell 112 based on the voltage value of every cell 112 acquired by the cell voltage sensor 12 and an SOC characteristic graph of the cells 112, and outputs the calculated SOC to the output manager 23 and the capacity calculator 26.

The capacity calculator 26 calculates the capacity of each cell 112 based on the current SOC of every cell 112 acquired by the SOC calculator 25. Further, the capacity calculator 26 calculates the product of the difference between the current SOC of each cell 112 obtained by the SOC calculator 25 and the usable lower limit SOC of each cell 112 and the capacity of each cell 112, to thereby derive the dischargeable capacity for every cell 112. Further, the capacity calculator 26 calculates the product of the difference between the usable upper limit SOC of the cell 112 and the current SOC of every cell 112 acquired by the SOC calculator 25 and the capacity of each cell 112, to thereby derive the chargeable capacity of every cell 112. The capacity calculator 26 outputs the derived capacity, dischargeable capacity, and chargeable capacity of each cell 112 to the output manager 23 and the equalizer 27.

The equalizer 27 has an equalizing circuit. The equalizer 27 controls the equalizing circuit to equalize the storage capacity among all the cells 112 by causing the cells 112 to discharge according to the dischargeable capacity of each cell 112 based on the capacity, dischargeable capacity, and chargeable capacity of each cell 112 read from the capacity calculator 26. Further, the equalizer 27 measures and detects the time spent on the equalization from the start of equalization control until completion thereof for each cell 112. The equalizer 27 reads the total value of the time having been spent on equalization until and including last time for each cell 112 stored in the recorder 29. The equalizer 27 adds, to the read total value, the time spent on equalization measured this time, and outputs the result as new total value data to the time stamper 30.

The time stamper 30 puts a time stamp including date and time on each of the open circuit voltage data and the voltage difference data from the voltage manager 21, the current data from the current manager 22, the current instruction value from the output manager 23, the data of total value of time having been spent on equalization from the equalizer 27, the temperature data of the battery pack 11 from the temperature sensor 115, and the temperature data of a coolant supplied for cooling the battery pack 11 from the IPU intake air temperature sensor 15, and outputs them to the recorder 29.

The recorder 29 as an accumulating unit accumulates data acquired by the state detecting unit.

Specifically, the recorder 29 stores, in the storage circuit, the data output from the time stamper 30, namely, the open circuit voltage data and the voltage difference data from the voltage manager 21, the current data from the current manager 22, the current instruction value data from the output manager 23, the data of total value of time having been spent on equalization from the equalizer 27, the temperature data of the battery pack 11 from the temperature sensor 115, and the temperature data of the coolant supplied for cooling the battery pack 11 from the IPU intake air temperature sensor 15. Further, the recorder 29 detects past data stored and accumulated in the recorder 29, namely, the open circuit voltage value data, the voltage difference data, the equalizing time having been spent on equalization of the cells 112, the total value data of equalizing time, that is, the cumulative total data of equalizing time having been spent on equalization which has been performed for a plurality of times in a predetermined period over all the cells 112 (hereinafter referred to as the "equalizing circuit total operation time"), the temperature data of the battery pack 11, the temperature data of intake air for the battery pack 11, and the current data of the battery pack 11, and outputs them to the failure determiner 28.

The failure determiner 28 as a determining unit determines whether there exists a failure of one of the electricity storage unit (the battery pack 11 and the cells 112) and the state detecting unit (the cell voltage sensors 12, the current sensor 13, the IPU intake air temperature sensor 15, and the temperature sensor 115) based on the accumulation data acquired from the recorder 29 as the accumulating unit. Specifically, the failure determiner 28 determines whether the cell voltage sensors 12, the current sensor 13, the IPU intake air temperature sensor 15, the temperature sensor 115 and the like have failed, or the battery pack 11 and the cells 112 have failed, based on the data stored in the recorder 29, namely, the open circuit voltage data from the voltage manager 21, the current data from the current manager 22, the current instruction value data from the output manager 23, the data of total value of time having been spent on equalization from the equalizer 27, the temperature data of the battery pack 11 from the temperature sensor 115, and the temperature data of the coolant supplied for cooling the battery pack 11 from the IPU intake air temperature sensor 15.

In the following, a description will be given of control that the ECU 20 exerts in the failure mode determination apparatus for an electricity storage system of the vehicle 1.

Firstly, as shown in FIG. 2, when an ignition switch is turned ON in the vehicle 1, in S11, the cell voltage sensors 12 (see FIG. 1) detect the voltage difference of every cell 112 in the battery pack 11 of the electricity storage apparatus that has a plurality of electricity storage modules 111 having a plurality of cells 112, and output the detected voltage difference to the time stamper 30. Then, the time stamper 30 receives the voltage difference data of every cell 112 detected by the cell voltage sensor 12, and puts a time stamp including the date and time on which the voltage difference was measured on the voltage difference data, thereafter outputting the time-stamped voltage difference data to the recorder 29. The recorder 29 stores the time-stamped voltage difference data. Then, control of the ECU 20 transits to S12.

In S12, the cell voltage sensors 12 detect the open circuit voltage of every cell 112 in the battery pack 11, and output the detected open circuit voltage to the time stamper 30. Then, the time stamper 30 receives the open circuit voltage value data of every cell 112 detected by the cell voltage sensor 12, and puts a time stamp including the date and time on which the open circuit voltage value was measured on the open circuit voltage value data, thereafter outputting the time-stamped open circuit voltage value data to the recorder 29. The recorder 29 stores the time-stamped open circuit voltage value data. Then, control of the ECU 20 transits to S13.

In S13, the failure determiner 28 reads the voltage difference calculated this time and the voltage difference calculated last time from the recorder 29. The failure determiner 28 calculates a gradient value (dx/dt) in a graph of the increase amount of the voltage difference relative to the elapsed time based on the read voltage differences, and outputs the calculation result to the time stamper 30. Then, the time stamper 30 receives the gradient value data from the failure determiner 28, and puts a time stamp including the data and time on which the gradient value was measured on the gradient value data, thereafter outputting the time-stamped gradient value data to the recorder 29. The recorder 29 stores the time-stamped gradient value data. Then, the failure determiner 28 determines whether or not the absolute value of the calculated gradient value exceeds a first threshold value A.

As represented by a solid line in FIG. 4, the voltage difference in the cells 112 becomes gradually greater with continuous use. Accordingly, the voltage difference gradient (the increase rate) becomes greater. Accordingly, when the voltage difference gradient (the increase rate) becomes gradually greater and exceeds the predetermined first threshold value A, it can be determined that the cells 112 have deteriorated (failed). In contrast, as indicated by a solid line in FIG. 3, when the voltage difference gradient (the increase rate) becomes abruptly greater and exceeds the predetermined first threshold value A, it is unlikely that the cells 112 have deteriorated (failed), and it is considered that the cell voltage sensors 12 have failed.

Accordingly, when the absolute value of the calculated gradient value exceeds the first threshold value A (YES), control of the ECU 20 transits to S14. When the absolute value of the calculated gradient value is equal to or smaller than the first threshold value A (NO), control of the ECU 20 returns to S11.

In S14, the failure determiner 28 reads, from the recorder 29, the gradient value calculated last time and the gradient value calculated the last but one time. Then, the failure determiner 28 determines whether or not the gradient value calculated last time or the gradient value calculated the last but one time is a value substantially equal to 0. When the gradient value calculated last time or the gradient value calculated the last but one time is a value substantially equal to 0 (YES), control of the ECU 20 transits to S15. When the gradient value calculated last time or the gradient value calculated the last but one time is not a value substantially equal to 0 (NO), control of the ECU 20 transits to S17.

In S15, the failure determiner 28 determines that a cell voltage sensor 12 has failed, and outputs the determination result to the transmitter 18. Then control of the ECU 20 transits to S16.

In S16, the failure determiner 28 identifies an ID of the cell voltage sensor 12 that has detected the voltage of a cell 112 with which the absolute value of the gradient value exceeds the first threshold value A among the voltage of every cell detected in S12 when the voltage difference detected in S11 is a maximum, and outputs the identified ID to the transmitter 18. Then, control of the ECU 20 returns to S11.

In S17, the failure determiner 28 determines that a cell 112 has failed, and outputs the determination result to the transmitter 18. Then, control of the ECU 20 transits to S18.

In S18, the failure determiner 28 identifies an ID of a cell 112 whose voltage value is extremely great or small, i.e., not being included in a second threshold value region B, among the open circuit voltage of every cell 112 detected in S12, and outputs the identified ID to the transmitter 18. Then, control of the ECU 20 returns to S11.

The present embodiment exhibits the following effect.

According to the present embodiment, the failure mode determination apparatus for an electricity storage system includes the battery pack 11 as an electricity storage unit, the state detecting unit (the cell voltage sensor 12, the current sensor 13, the IPU intake air temperature sensor 15, and the temperature sensor 115) for detecting the state of the battery pack 11, the recorder 29 as an accumulating unit for accumulating data acquired by the state detecting unit, and failure determiner 28 as a determining unit for determining whether there exists a failure of one of the electricity storage unit and the state detecting unit based on the accumulation data acquired from the recorder 29.

Thus, use of the past accumulation data of the voltage difference makes it possible to discern between a failure of any cell voltage sensor 12 and deterioration (failure) of any cell 112, which ensures detection of an occurrence of deterioration of the cells 112 structuring the battery pack 11. Accordingly, whether there exists a failure of one of the electricity storage unit and the state detecting unit can be determined.

In the case where a determination is made that any cell 112 of the battery pack 11 has failed despite the fact that a cell voltage sensor 12 has failed, the battery pack 11 is replaced despite the fact that replacement of just the cell voltage sensor 12 will suffice. However, in the present embodiment, since the failure mode can be recognized using the singularity of the accumulated data, a failure mode can be determined. Accordingly, just the failed site (the cell voltage sensor 12 or the battery pack 11) can be replaced, and therefore the product warranty cost can be largely reduced.

Further, since the failure mode can be determined, before the vehicle with any failure is garaged for recovery, the accumulation data including the failure mode is transmitted to the garage from the transmitter 18. Thus, the failure mode can be previously grasped, and a component corresponding to the failed component can be prepared at an early stage. Thus, when the vehicle with any failure is garaged, the failed site can be immediately replaced. Consequently, the trouble can be solved earlier.

Further, the state detecting unit measures the voltage of the cell 112 as the electricity storage unit. The accumulating unit accumulates the voltage difference as a differential value between a first voltage value acquired from the electricity storage unit and a second voltage value acquired later than the first voltage value. The determining unit determines which one of the electricity storage unit and the state detecting unit has failed, based on the voltage difference as the accumulated differential value.

Thus, the voltage of cells 112 as the electricity storage unit is detected, and the voltage difference being the differential value of the voltage values is accumulated and used. Accordingly, which one of the electricity storage unit and the state detecting unit has failed can be determined. Therefore, without the necessity of newly providing a structure for determining which one of the electricity storage unit and the state detecting unit has failed, such a determination can be easily made.

Second Embodiment

Figure 5:
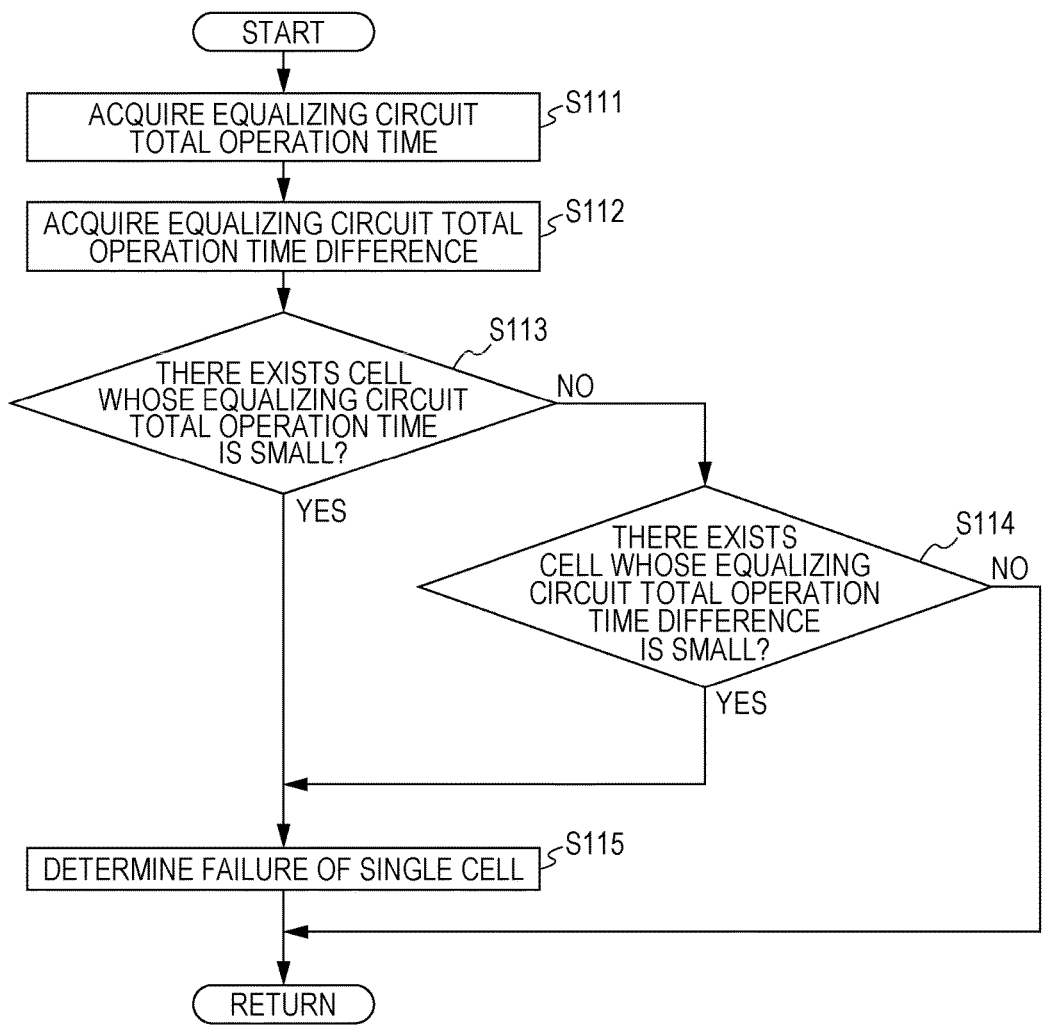
FIG. 5 is a flowchart showing a failure mode determining process in a failure mode determination apparatus for an electricity storage system according to a second embodiment of the present invention.

In the following, with reference to FIG. 5, a description will be given of a second embodiment of the present invention. FIG. 5 is a flowchart showing a failure mode determining process in a failure mode determination apparatus for an electricity storage system according to the second embodiment of the present invention. The failure mode determination apparatus for an electricity storage system according to the present embodiment is different from the first embodiment mainly in that a determination of a failure mode is made using an operation total time of the equalizing circuit in equalizing the charge amount of the cells 112.

In the following, a description will be given of control that the ECU 20 exerts in the failure mode determination apparatus for an electricity storage system of the vehicle 1 according to the second embodiment. The ECU 20 exerts control in the failure mode determination apparatus for an electricity storage system of the vehicle 1 according to the second embodiment based on the premise that equalization of the cells 112 is performed at predetermined time intervals.

In equalization of the cells 112, when the charge amount varies among the cells 112 and the charge amount of a given cell 112 is extremely greater or smaller than the charge amount of other cells 112, the equalizer 27 actuates the equalizing circuit to equalize the charge amount of the cells 112. Then, the equalizer 27 outputs the time during which equalization is performed, that is, data of time during which the equalizing circuit is operating (hereinafter referred to as the "equalizing time data") to the time stamper 30. Then, the time stamper 30 receives the equalizing time data and puts a time stamp including the date and time on which the equalization was performed on the equalizing time data, thereafter outputting the time-stamped equalizing time data to the recorder 29. The recorder 29 stores the time-stamped equalizing time data.

Firstly, in S111, the failure determiner 28 reads the time-stamped equalizing time data which is obtained from equalization performed for a plurality of times in a predetermined period and accumulated in the recorder 29. Then, the failure determiner 28 calculates the equalizing circuit total operation time for every cell 112 using the read equalizing time data. Then, control of the ECU 20 transits to S112.

In S112, the failure determiner 28 calculates the difference between the cumulative time spent on equalization until and including this time and the cumulative time spent on equalization until and including last time (hereinafter referred to as the "equalizing circuit total operation time difference") for every cell 112, using the equalizing time data read from recorder 29 in S111. Then, control of the ECU 20 transits to S113.

In S113, the failure determiner 28 determines whether there exists a cell 112 whose equalizing circuit total operation time calculated in S111 is smaller than a third threshold value C. When there exists the cell 112 whose equalizing circuit total operation time is smaller than the third threshold value C (YES), control of the ECU 20 transits to S115. When there does not exist the cell 112 whose equalizing circuit total operation time is smaller than the third threshold value C (NO), control of the ECU 20 transits to S114.

In S114, when there exists the cell 112 whose equalizing circuit total operation time difference calculated in S112 is smaller than a fourth threshold value D (YES), control of the ECU 20 transits to S115. When there does not exist the cell 112 whose equalizing circuit total operation time difference is smaller than the fourth threshold value D (NO), control of the ECU 20 returns to S111.

In S115, the failure determiner 28 determines that the cell 112 has failed, and outputs the determination result to the transmitter 18. Then, control of the ECU 20 returns to S111.

The present embodiment exhibits the following effect.

According to the present embodiment, the battery pack 11 as the electricity storage unit is structured by the cells 112 as a plurality of electricity storage cells. The equalizer 27 as the state detecting unit detects equalizing time required for equalization of the storage capacity of the cells 112. The recorder 29 as the accumulating unit detects the total value of the equalizing time. The failure determiner 28 as the determining unit determines which one of the electricity storage unit and the state detecting unit has failed, based on the total value in the recorder 29.

Thus, it becomes possible to detect even a failure of a cell 112 which is difficult to detect with the cell voltage sensors 12, and to determine that the cell 112 has failed.

Third Embodiment

Figure 6:
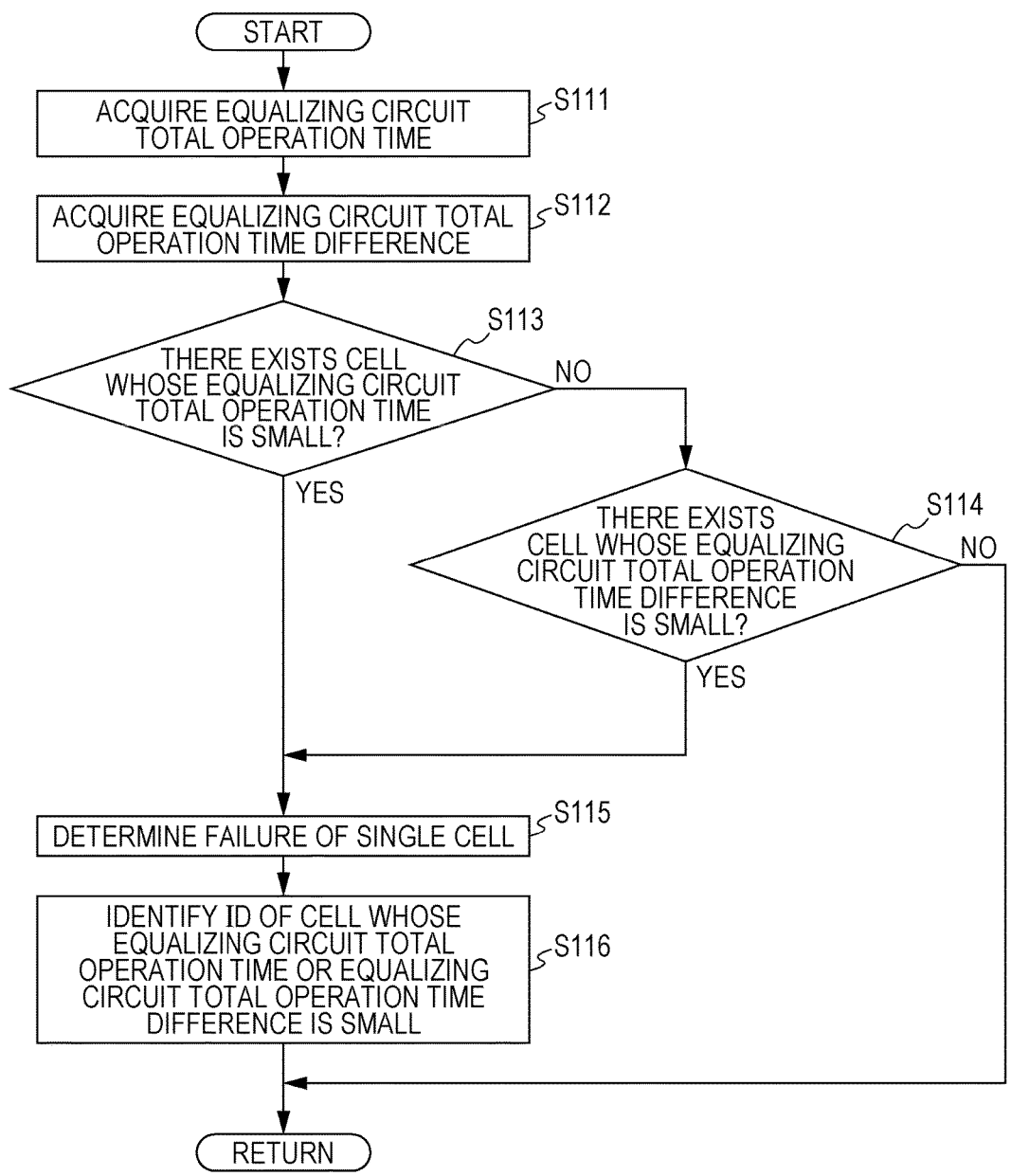
FIG. 6 is a flowchart showing a failure mode determining process in a failure mode determination apparatus for an electricity storage system according to a third embodiment of the present invention.

In the following, with reference to FIG. 6, a description will be given of a third embodiment of the present invention. FIG. 6 is a flowchart showing a failure mode determining process in a failure mode determination apparatus for an electricity storage system according to the third embodiment of the present invention.

The failure mode determination apparatus for an electricity storage system according to the present embodiment is different from the second embodiment in that the ID of a cell 112 is identified as to which cell 112 has failed, upon determination of a failure of a cell 112. Since the rest of the structure of the third embodiment is similar to that of the second embodiment, identical members or processes are denoted by identical reference characters, and the description thereof will be omitted.

In the following, a description will be given of control that the ECU 20 exerts in the failure mode determination apparatus for an electricity storage system of the vehicle 1 according to the third embodiment. In control exerted by the ECU 20 in the failure mode determination apparatus for an electricity storage system of the vehicle 1 according to the third embodiment, S111 to S114 are identical to S111 to S114 in control exerted by the ECU 20 according to the second embodiment. In S115, the failure determiner 28 determines that a cell 112 has failed, and outputs the determination result to the transmitter 18. Then, control of the ECU 20 transits to S116.

In S116, the failure determiner 28 reads the equalizing circuit total operation time data and the equalizing circuit total operation time difference data stored in the recorder 29. Then, the failure determiner 28 identifies the ID of a cell whose equalizing circuit total operation time calculated in S111 is smaller than the third threshold value C, or the ID of a cell whose equalizing circuit total operation time difference calculated in S114 is smaller than the fourth threshold value D, and outputs the identified ID to the transmitter 18. Then, control of the ECU 20 returns to S111.

The present embodiment exhibits the following effect.

According to the present embodiment, upon a determination of a failure of a cell 112, the ID of the cell 112 can be identified. Thus, since which cell 112 has failed can be grasped in replacing the cell 112, the replacing work or the like of the cell 112 can be efficiently performed.

Fourth Embodiment

In the following, with reference to FIGS. 7 to 9, a description will be given of a fourth embodiment of the present invention.

Figure 7:
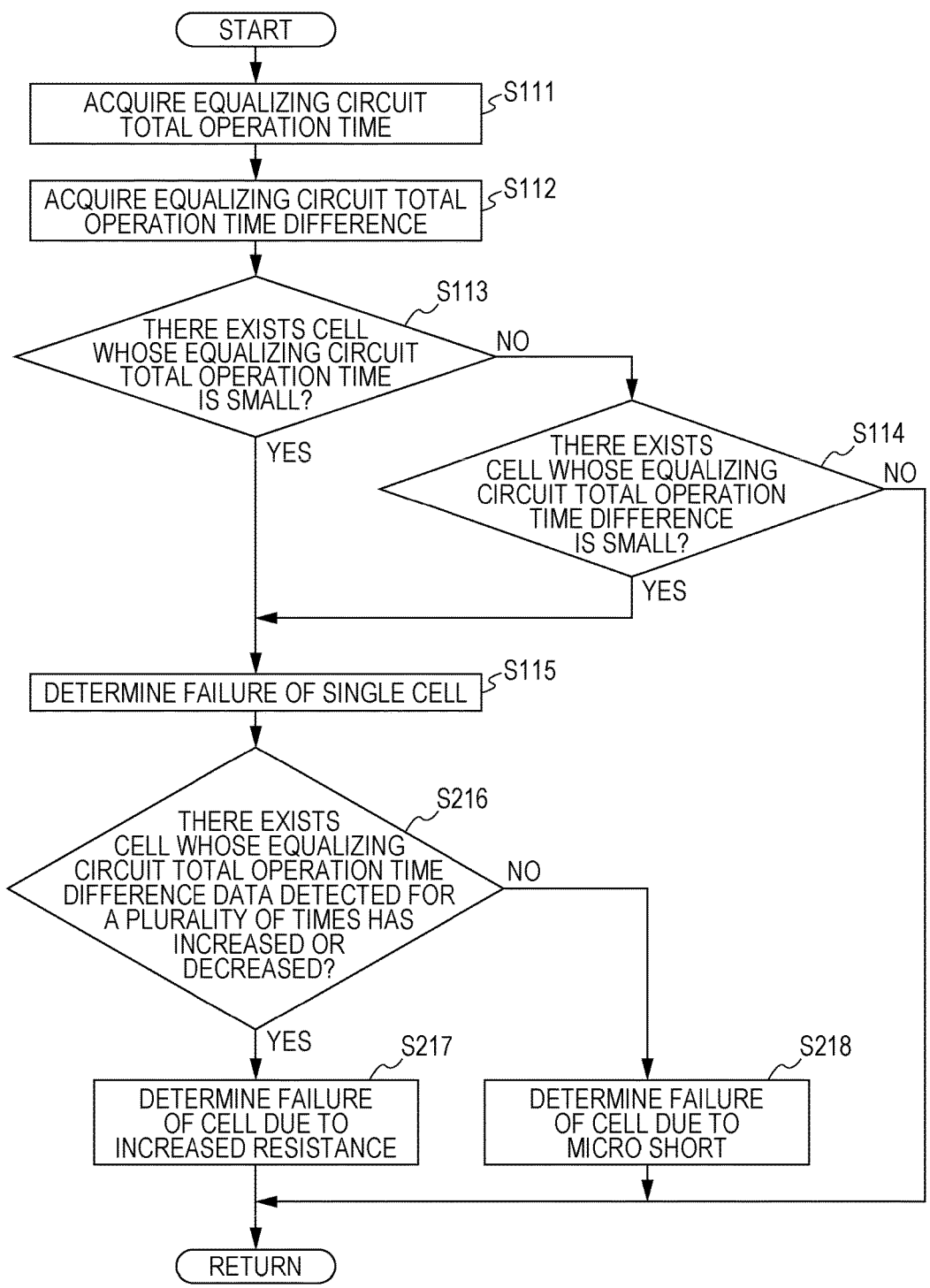
FIG. 7 is a flowchart showing a failure mode determining process in a failure mode determination apparatus for an electricity storage system according to a fourth embodiment of the present invention.

FIG. 7 is a flowchart showing a failure mode determining process in a failure mode determination apparatus for an electricity storage system according to the fourth embodiment of the present invention. FIG. 8 is a graph showing the case where a failure of a cell 112 due to micro short is detected in the failure mode determination apparatus for an electricity storage system according to the fourth embodiment of the present invention. FIG. 9 is a graph showing the case where a failure of a cell 112 due to increased resistance is detected in the failure mode determination apparatus for an electricity storage system according to the fourth embodiment of the present invention.

The failure mode determination apparatus for an electricity storage system according to the present embodiment is different from the second embodiment in that, upon a determination of a failure of a cell 112, to what failure mode the failure of the cell 112 corresponds is identified. Since the rest of the structure of the fourth embodiment is similar to that of the second embodiment, identical members or processes are denoted by identical reference characters, and the description thereof will be omitted.

In the following, a description will be given of control that the ECU 20 exerts in the failure mode determination apparatus for an electricity storage system of the vehicle 1 according to the fourth embodiment. In control exerted by the ECU 20 in the failure mode determination apparatus for an electricity storage system of the vehicle 1 according to the fourth embodiment, S111 to S114 are identical to S111 to S114 in control exerted by the ECU 20 according to the second embodiment.

In S115, the failure determiner 28 determines that the cell 112 has failed, and outputs the determination result to the transmitter 18. Then, control of the ECU 20 transits to S216.

In S216, the failure determiner 28 determines whether there exists any cell 112 whose equalizing circuit total operation time difference calculated in S112 has increased or decreased.

Figure 8:
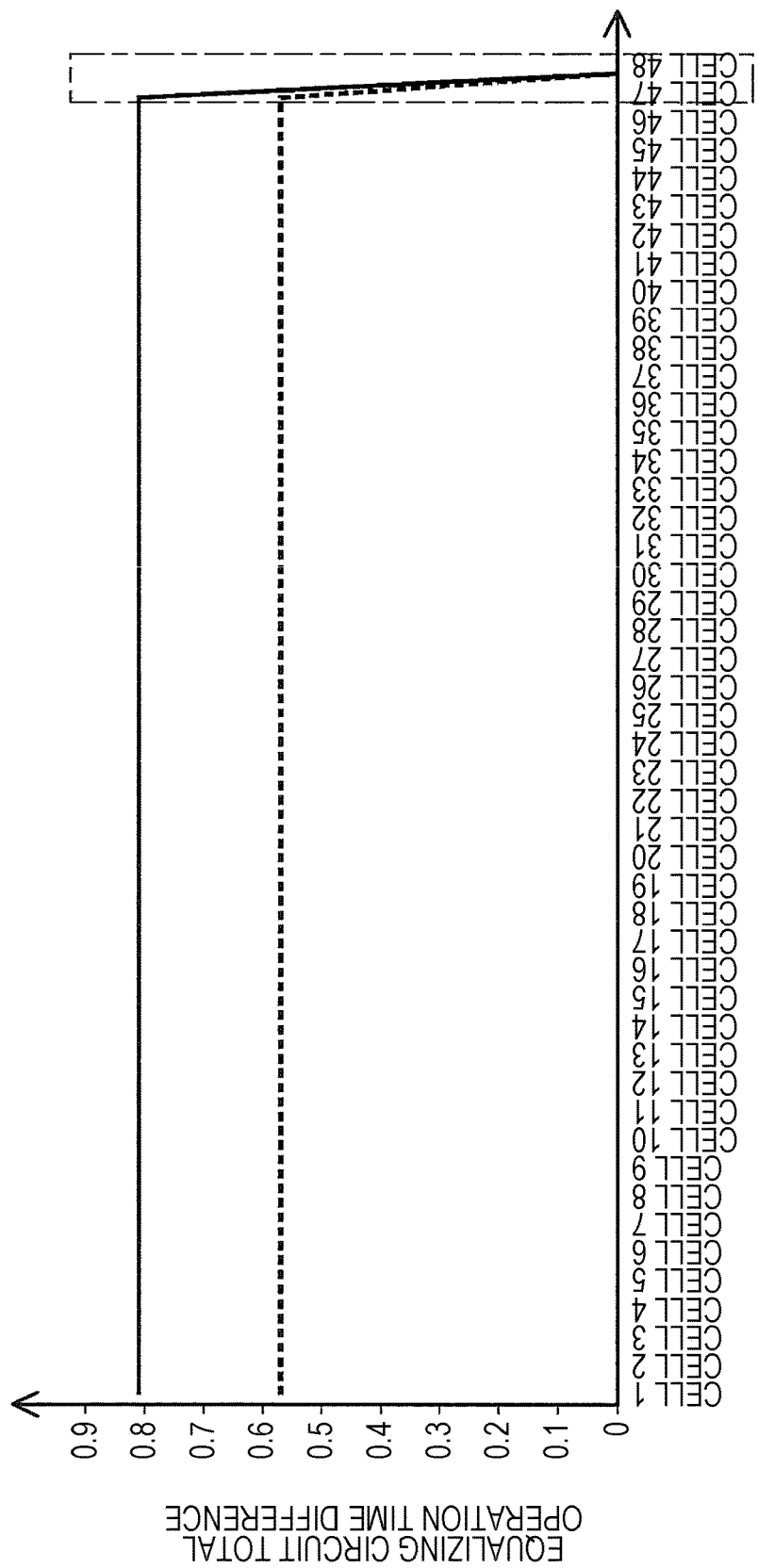
FIG. 8 is a graph showing the case where a failure of a cell due to micro short is detected in the failure mode determination apparatus for an electricity storage system according to the fourth embodiment of the present invention.
Figure 9:
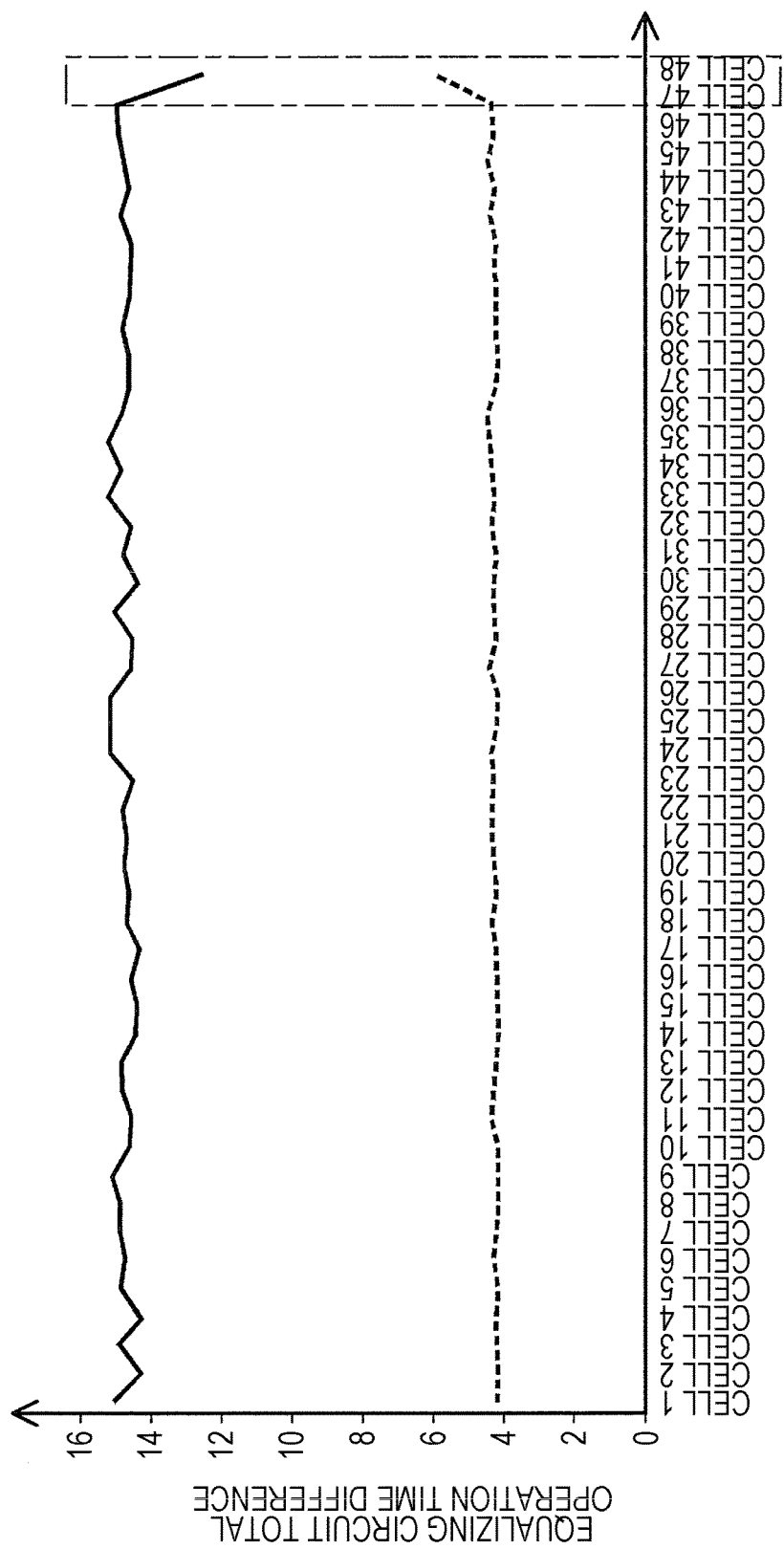
FIG. 9 is a graph showing the case where a failure of a cell due to increased resistance is detected in the failure mode determination apparatus for an electricity storage system according to the fourth embodiment of the present invention.

Specifically, as represented by the 48th cell 112 surrounded by an alternate long and short dashed line in FIG. 9, whether or not the equalizing circuit total operation time difference that includes the time spent on equalization until and including this time has decreased and the equalizing circuit total operation time difference that includes the time spent on equalization until and including last time has increased is determined. In each of FIGS. 8 and 9, a solid line represents the equalizing circuit total operation time difference including the time spent on equalization until and including this time, and a broken line represents the equalizing circuit total operation time difference including the time spent on equalization until and including last time.

As shown in FIG. 9, when the equalizing circuit total operation time differences have decreased or increased, it is considered that the cell 112 has failed due to increased resistance in the cell 112. Accordingly, when the equalizing circuit total operation time difference including the time spent on equalization until and including this time has decreased and the equalizing circuit total operation time difference spent until and including last time has increased (YES), control of the ECU 20 transits to S217.

Further, for example, in the case where micro short has occurred in a cell 112, as represented by the 48th cell 112 surrounded by an alternate long and short dashed line in FIG. 8, both the equalizing circuit total operation time difference including the time spent on equalization until and including this time and the equalizing circuit total operation time difference including the time spent on equalization until and including last time may decrease. Here, in the case where the equalizing circuit total operation time difference including the time spent on equalization until and including this time has decreased and the equalizing circuit total operation time difference including the time spent on equalization until and including last time has not increased, for example, when both the equalizing circuit total operation time difference including the time spent on equalization until and including this time and the equalizing circuit total operation time difference including the time spent on equalization until and including last time have sharply decreased (NO), control of the ECU 20 transits to S218.

In S217, the failure determiner 28 determines that the cell 112 has failed due to increased resistance, and outputs the determination result to the transmitter 18. Then, control of the ECU 20 returns to S111. In S218, the failure determiner 28 determines that the cell 112 has failed due to an occurrence of micro short, and outputs the determination result to the transmitter 18. Then, control of the ECU 20 returns to S111.

The present embodiment exhibits the following effect.

According to the present embodiment, the mode of a failure, for example, a failure of the cell 112 due to increased resistance or a failure of the cell 112 due to an occurrence of micro short can be determined. Accordingly, the mode of a failure that tends to occur in the battery pack 11 in which the cell 112 is used can be grasped.

Fifth Embodiment

Figure 10:
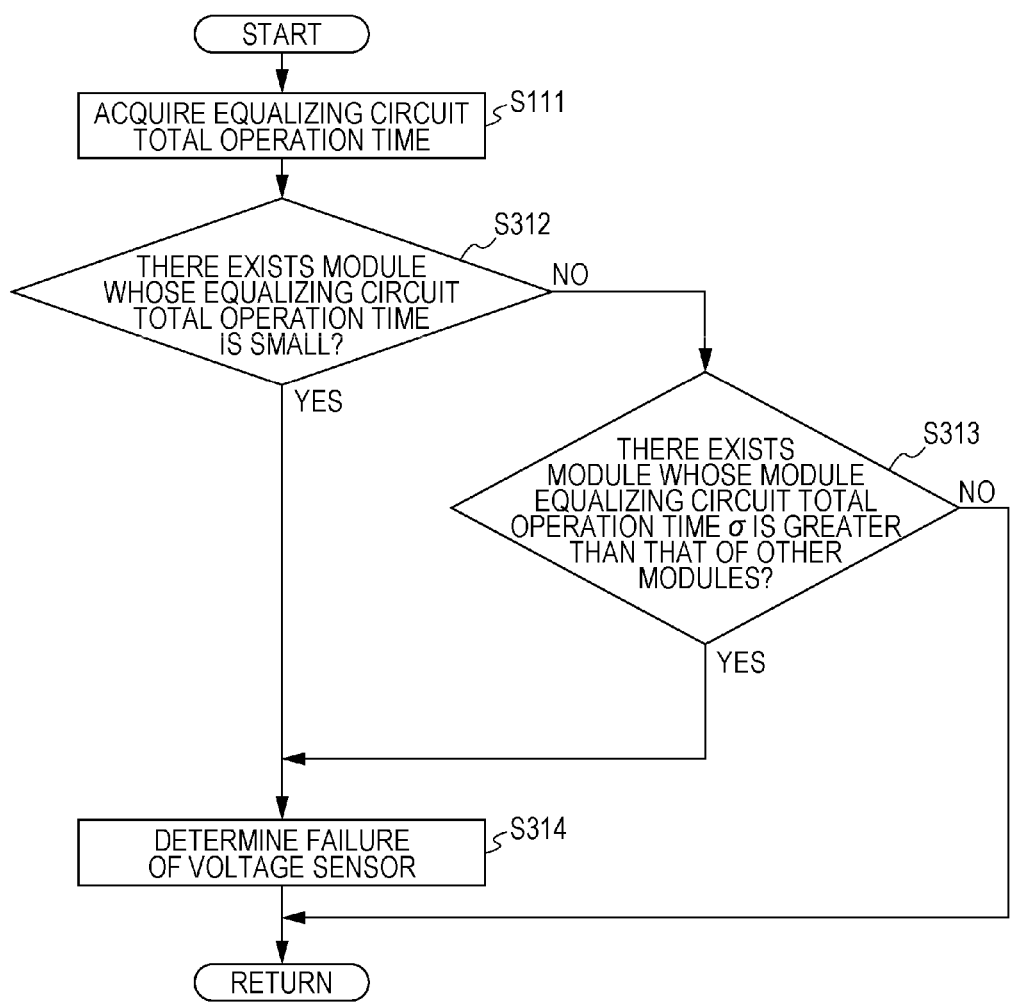
FIG. 10 is a flowchart showing a failure mode determining process in a failure mode determination apparatus for an electricity storage system according to a fifth embodiment of the present invention.

In the following, with reference to FIG. 10, a description will be given of a fifth embodiment of the present invention. FIG. 10 is a flowchart showing a failure mode determining process in a failure mode determination apparatus for an electricity storage system according to the fifth embodiment of the present invention.

The failure mode determination apparatus for an electricity storage system according to the present embodiment is different from the second embodiment in that a determination as to whether or not a cell voltage sensor 12 has failed is made. Since the rest of the structure of the fifth embodiment is similar to that of the second embodiment, identical members or processes are denoted by identical reference characters, and the description thereof will be omitted.

In the following, a description will be given of control that the ECU 20 exerts in the failure mode determination apparatus for an electricity storage system of the vehicle 1 according to the fifth embodiment.

Firstly, in S111, the failure determiner 28 reads time-stamped equalizing time data which is obtained from equalization performed for a plurality of times in a predetermined period and accumulated in the recorder 29. Then, the failure determiner 28 calculates the equalizing circuit total operation time for every cell 112 using the read equalizing time data. Then, control of the ECU 20 transits to S312.

In S312, the failure determiner 28 determines whether there exists an electricity storage module 111 which is structured only by cells 112 whose equalizing circuit total operation time calculated in S111 for every cell 112 is smaller than a fifth threshold value E. The fifth threshold value E is set to a proper value by the failure determiner 28 taking into consideration of the equalizing circuit total operation time of cells 112 included in other electricity storage modules 111. When there exists any electricity storage module 111 structured only by cells 112 whose equalizing circuit total operation time is smaller than the fifth threshold value E (YES), control of the ECU 20 transits to S314. When there does not exist any electricity storage module 111 structured only by cells 112 whose equalizing circuit total operation time is smaller than the fifth threshold value E (NO), control of the ECU 20 transits to S313.

In S313, the failure determiner 28 calculates, based on the equalizing circuit total operation time calculated in S111, an equalizing circuit total operation time σ for each electricity storage module 111 (hereinafter referred to as the "module equalizing circuit total operation time a"). Then, the failure determiner 28 determines whether there exists an electricity storage module 111 whose module equalizing circuit total operation time σ is greater than a sixth threshold value F. The sixth threshold value F is set to a proper value by the failure determiner 28 taking into consideration of the module equalizing circuit total operation time σ of other electricity storage modules 111. When there exists any electricity storage module 111 whose module equalizing circuit total operation time σ is greater than the sixth threshold value F (YES), control of the ECU 20 transits to S314. When there does not exist any electricity storage module 111 whose module equalizing circuit total operation time σ is greater than the sixth threshold value F (NO), control of the ECU 20 returns to S111.

In S314, the failure determiner 28 determines that the cell voltage sensor 12 has failed, and outputs the determination result to the transmitter 18. Then, control of the ECU 20 returns to S111.

The present embodiment exhibits the following effect.

According to the present embodiment, whether the equalizing circuit total operation time for each electricity storage module 111 (the module equalizing circuit total operation time σ) is greater or smaller than threshold values is determined. Thus, using the singularity of the equalizing circuit total operation time in the case where the cell voltage sensor 12 provided for each electricity storage module 111 has failed, whether or not the cell voltage sensor 12 has failed can be determined.

Sixth Embodiment

In the following, with reference to FIGS. 11 to 13, a description will be given of a sixth embodiment of the present invention.

Figure 11:
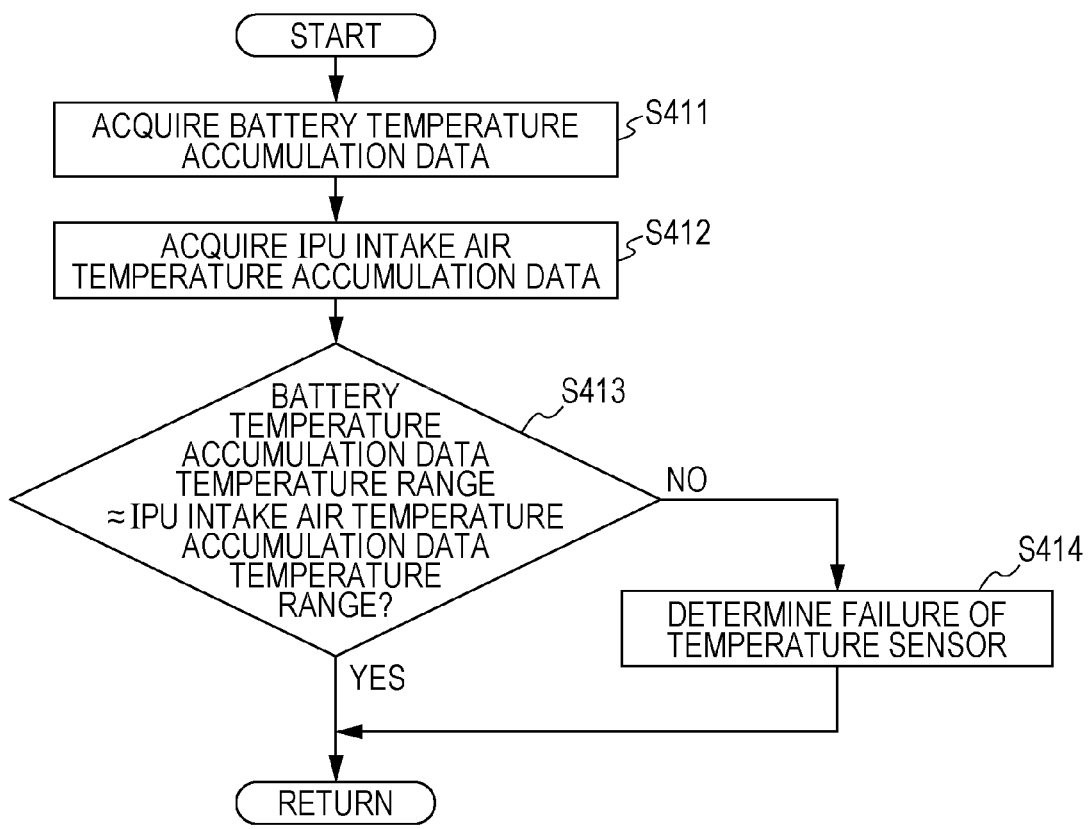
FIG. 11 is a flowchart showing a failure mode determining process in a failure mode determination apparatus for an electricity storage system according to a sixth embodiment of the present invention.

FIG. 11 is a flowchart showing a failure mode determining process in a failure mode determination apparatus for an electricity storage system according to the sixth embodiment of the present invention. FIG. 12 is a graph showing the frequency distribution of temperatures of the battery pack 11 during traveling acquired in the failure mode determination apparatus for an electricity storage system according to the sixth embodiment of the present invention. FIG. 13 is a graph showing the frequency distribution of temperatures of intake air introduced to the battery acquired in the failure mode determination apparatus for an electricity storage system according to the sixth embodiment of the present invention.

The failure mode determination apparatus for an electricity storage system according to the present embodiment is different from the first embodiment in that, in the present embodiment, whether or not the temperature sensor 115 has failed is determined based on the temperature of the battery pack 11 detected by the temperature sensor 115 of the battery pack 11, and the temperature of intake air introduced to the battery pack 11 detected by the IPU intake air temperature sensor 15.

In the following, a description will be given of control that the ECU 20 exerts in the failure mode determination apparatus for an electricity storage system of vehicle 1 according to the sixth embodiment.

Firstly, in S411, the failure determiner 28 reads, from the recorder 29, the temperature data of the battery pack 11 which has been detected by the temperature sensor 115 of the battery pack 11, time-stamped, and cumulatively stored in the recorder 29. Then, control of the ECU 20 transits to S412.

In S412, the failure determiner 28 reads, from the recorder 29, the temperature data of intake air to the battery pack 11 which has been detected by the IPU intake air temperature sensor 15, time-stamped and cumulatively stored in the recorder 29. Then, control of the ECU 20 transits to S413.

Figure 12:
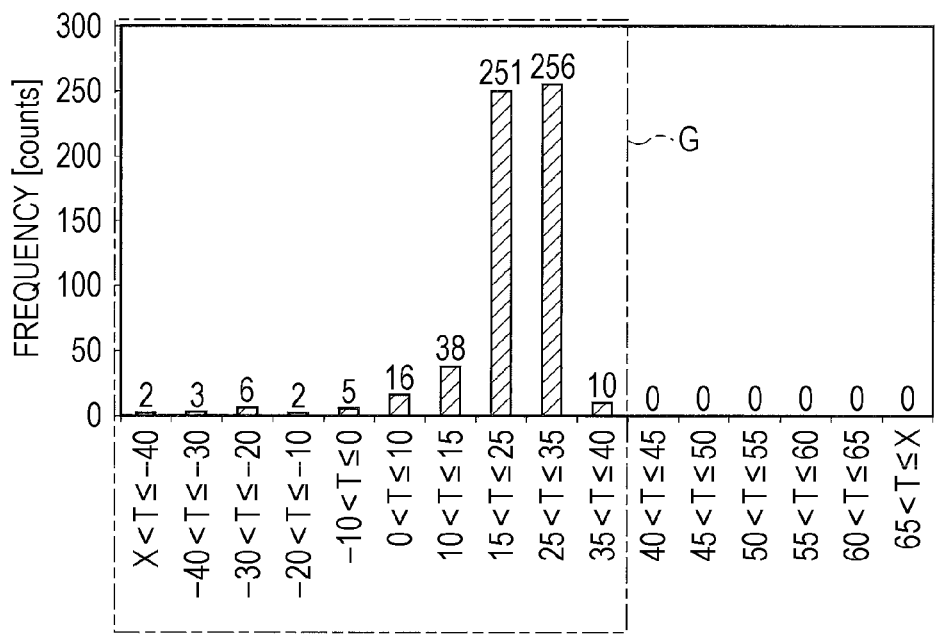
FIG. 12 is a graph showing frequency distribution of the temperature of a battery pack 11 during traveling that is acquired in the failure mode determination apparatus for an electricity storage system according to the sixth embodiment of the present invention.

In S413, the failure determiner 28 creates the temperature distribution of the battery pack 11 as shown in FIG. 12 from the temperature data of the battery pack 11 having been detected and accumulated in a predetermined period. Further, similarly, the failure determiner 28 creates the intake air temperature distribution as shown in FIG. 13 from the temperature data of intake air to the battery pack 11 having been detected and accumulated in a predetermined period. Then, the failure determiner 28 compares the temperature distribution of the battery pack 11 and the intake air temperature distribution against each other, and determines whether or not the temperature range of the temperature distribution of the battery pack 11 and the temperature range of the intake air temperature distribution substantially match with each other.

Figure 13:
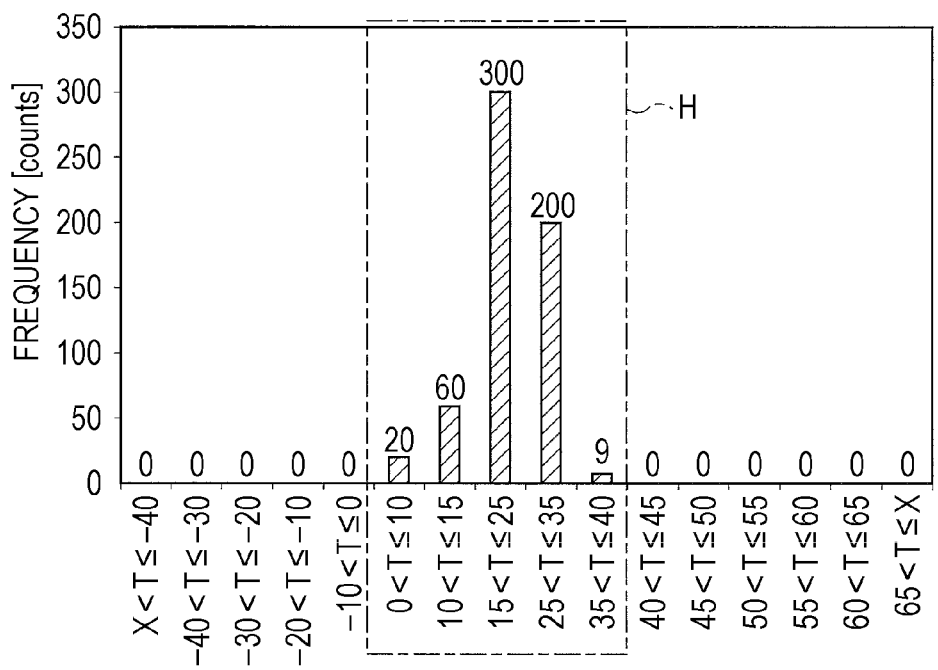
FIG. 13 is a graph showing temperature frequency distribution of intake air introduced to a battery that is acquired in the failure mode determination apparatus for an electricity storage system according to the sixth embodiment of the present invention.

Specifically, in the case where a temperature range G in the temperature distribution of the battery pack 11 as shown in FIG. 12 and a temperature range H in the intake air temperature distribution as shown in FIG. 13 largely differ from each other, it is highly possible that the temperature sensor 115 has failed. Accordingly, a determination is made as to whether or not the temperature range G in the temperature distribution of the battery pack 11 is included by a proportion of a seventh threshold value J in a 0° C. to 40° C. range H which is the temperature range in the intake air temperature distribution. When the temperature range G in the temperature distribution of the battery pack 11 is included in the temperature range H in the intake air temperature distribution by the proportion equal to or greater than the seventh threshold value (YES), control of the ECU 20 returns to S411. When the temperature distribution of the battery pack 11 is included in the temperature range in the intake air temperature distribution by the proportion smaller than the seventh threshold value (NO), control of the ECU 20 transits to S414.

In S414, the failure determiner 28 determines that the temperature sensor 115 has failed, and outputs the determination results to the transmitter 18. Then, control of the ECU 20 returns to S411.

The present embodiment exhibits the following effect.

According to the present embodiment, whether or not the temperature sensor 115 has failed can be easily determined using the temperature distribution of the battery pack 11 and the intake air temperature distribution.

Seventh Embodiment

In the following, with reference to FIGS. 14 to 16, a description will be given of a seventh embodiment of the present invention.

Figure 14:
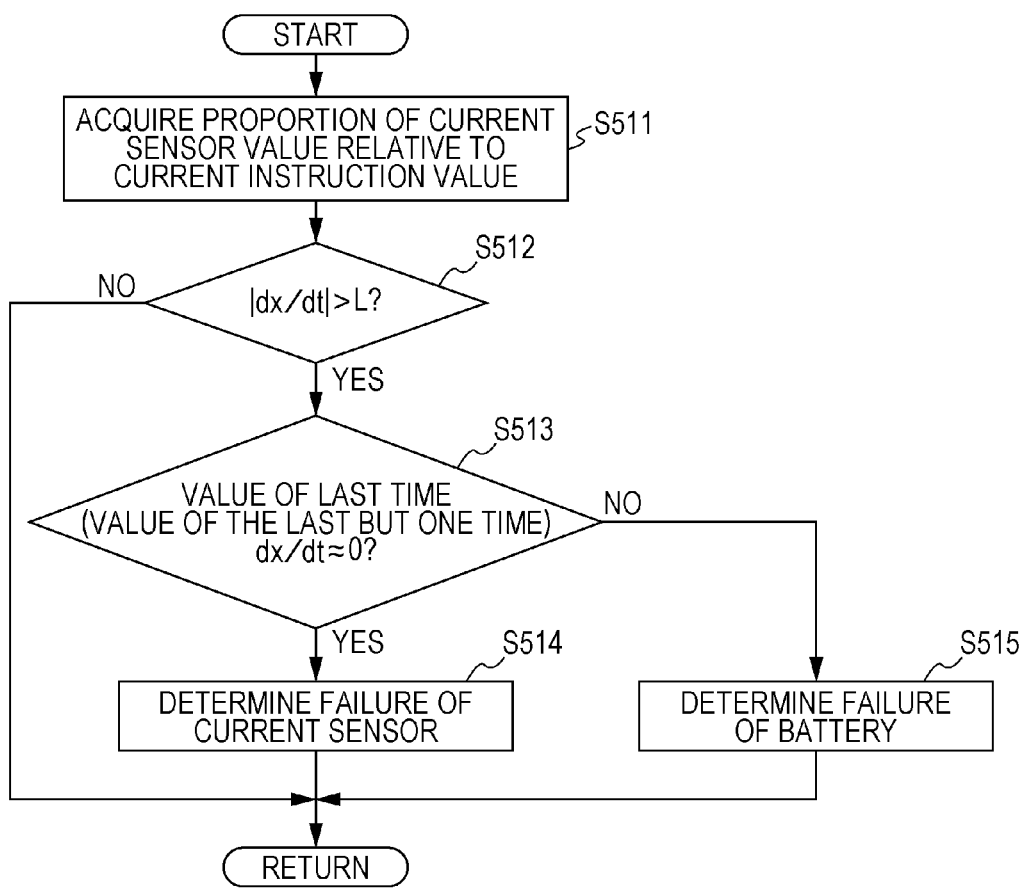
FIG. 14 is a flowchart showing a failure mode determining process in a failure mode determination apparatus for an electricity storage system according to a seventh embodiment of the present invention.

FIG. 14 is a flowchart showing a failure mode determining process in a failure mode determination apparatus for an electricity storage system according to the seventh embodiment of the present invention. FIG. 15 is a graph showing the case where a failure of a cell 112 of the battery pack 11 is detected in the failure mode determination apparatus for an electricity storage system according to the seventh embodiment of the present invention. FIG. 16 is a graph showing the case where a failure of the current sensor 13 is detected in the failure mode determination apparatus for an electricity storage system according to the seventh embodiment of the present invention.

The failure mode determination apparatus for an electricity storage system according to the present embodiment is different from the first embodiment in that a failure mode is determined using the current value of the battery pack 11 detected by the current sensor 13.

In the following, a description will be given of control that the ECU 20 exerts in the failure mode determination apparatus for an electricity storage system of the vehicle 1 according to the seventh embodiment.

Firstly, in S511, the failure determiner 28 reads, from the recorder 29, the current data of the battery pack 11 which has been detected by the current sensor 13 in a predetermined period, time-stamped and cumulatively stored in the recorder 29. Similarly, the failure determiner 28 reads, from the recorder 29, the current instruction value data which has been issued from the current manager 22 in a predetermined period, time-stamped and cumulatively stored in the recorder 29. Then, as shown in FIGS. 15 and 16, the failure determiner 28 calculates the proportion (ratio) of the current value of the current data read from the recorder 29 relative to the current instruction value issued from the current manager 22 in the predetermined period. Then, control of the ECU 20 transits to S512.

Figure 15:
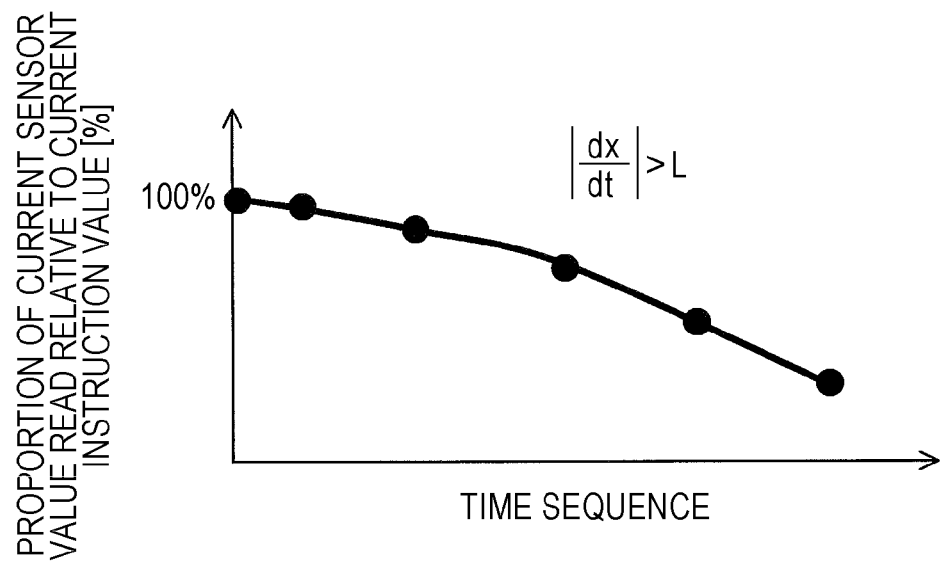
FIG. 15 is a graph showing the case where a failure of a cell of a battery pack 11 is detected in the failure mode determination apparatus for an electricity storage system according to the seventh embodiment of the present invention.
Figure 16:
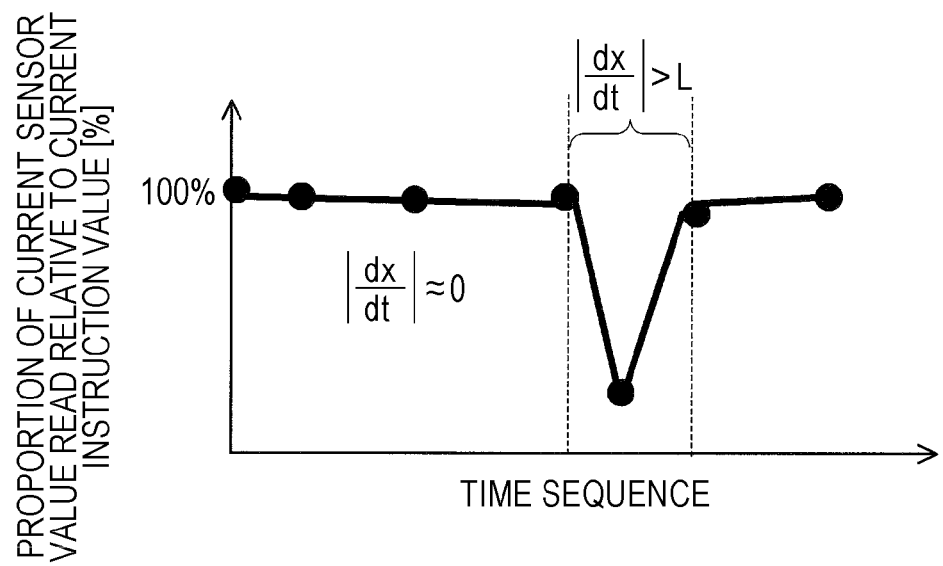
FIG. 16 is a graph showing the case where a failure of a current sensor is detected in the failure mode determination apparatus for an electricity storage system according to the seventh embodiment of the present invention.

With continuous use of the battery pack 11, as shown in FIG. 15, the absolute value of the proportion (ratio) of the current value of the current data gradually decreases, and the absolute value of the gradient thereof (dx/dt) increases. Accordingly, when the absolute value of the gradient (dx/dt) of the proportion (ratio) relative to time becomes greater than a predetermined eighth threshold value L, it can be determined that the battery pack has deteriorated (failed). On the other hand, as shown in FIG. 16, when the absolute value of the gradient (dx/dt) of the proportion (ratio) relative to the elapsed time abruptly became greater than a predetermined threshold value, it is unlikely that the battery pack has deteriorated (failed), and it is highly possible that the current sensor 13 has failed.

Accordingly, in S512, the failure determiner 28 determines whether or not the absolute value of the gradient (dx/dt) of the proportion (ratio) relative to time is greater than the eighth threshold value L. When the absolute value of the gradient (dx/dt) of the proportion (ratio) relative to time is greater than the eighth threshold value L (YES), control of the ECU 20 transits to S513. When the absolute value of the gradient (dx/dt) of the proportion (ratio) relative to time is not greater than the eighth threshold value L (NO), control of the ECU 20 returns to S511.

In S513, the failure determiner 28 determines whether or not the absolute value of the gradient (dx/dt) of the proportion (ratio) relative to time derived from the current value of the last time and the current instruction value of the last time is a value substantially equal to 0. When the absolute value of the gradient (dx/dt) of the proportion (ratio) relative to time is a value substantially equal to 0 (YES), control of the ECU 20 transits to S514. When the absolute value of the gradient (dx/dt) of the proportion (ratio) relative to time is not a value substantially equal to 0 (NO), control of the ECU 20 transits to S515.

In S514, the failure determiner 28 determines that the current sensor 13 has failed, and outputs the determination result to the transmitter 18. Then, control of the ECU 20 returns to S511. In S515, the failure determiner 28 determines that the battery pack 11 has deteriorated (failed), and outputs the determination result to the transmitter 18. Then, control of the ECU 20 returns to S511.

The present embodiment exhibits the following effect.

According to the present embodiment, which one of the current sensor 13 and the battery pack 11 has failed can be determined, using the proportion (ratio) of the current value detected by the current sensor 13 relative to the current instruction value.

The present invention is not limited to the above-described embodiments, and the present invention includes modifications and improvements which are made within a range in which the object of the present invention is attained.

For example, in the fourth embodiment, while a failure of a cell 112 due to micro short and a failure of a cell 112 due to increased resistance are determined, the present invention is not limited thereto. Further, in the present embodiment, while the state detecting unit is structured by the cell voltage sensors 12, the current sensor 13, the IPU intake air temperature sensor 15, and the temperature sensor 115, the present invention is not limited thereto. Further, in the failure mode determination apparatus for an electricity storage system, for example, any of server determination by telematics (registered trademark) and on-board diagnostic may be performed.

Further, in the present embodiments, while the cell voltage sensors 12 detect open circuit voltage of the cells 112, the present invention is not limited thereto. The cell voltage sensors may detect closed circuit voltage in place of open circuit voltage.

According to one aspect of the present invention, a failure mode determination apparatus for an electricity storage system includes an electricity storage unit (for example, a battery pack 11, electricity storage modules 111, and cells 112, which will be described later), a state detecting unit for detecting a state of the electricity storage unit (for example, cell voltage sensors 12, a current sensor 13, an IPU (Intelligent Power Unit) intake air temperature sensor 15, and a temperature sensor 115, which will be described later), an accumulating unit for accumulating data acquired by the state detecting unit (for example, a recorder 29, which will be described later), and a determining unit for determining, based on accumulation data acquired from the accumulating unit, whether there exists a failure of one of the electricity storage unit and the state detecting unit (for example, a failure determiner 28, which will be described later).

According to the present aspect, since a determination is made based on the accumulated accumulation data acquired by the state detecting unit, whether there exists a failure of one of the electricity storage unit and the state detecting unit can be determined. That is, a failure mode determination apparatus for an electricity storage system capable of determining whether there exists a failure of a battery or a failure of a sensor for detecting deterioration (failure) of the battery can be provided.

In the case where a determination is made that the electricity storage unit has failed despite the fact the state detecting unit has failed, the electricity storage unit is replaced despite the fact that replacement of just the state detecting unit will suffice. However, in an embodiment of the present invention, since the failure mode can be recognized using the singularity of the accumulated data, a failure mode can be determined. Accordingly, just the failed site (the electricity storage unit or the state detecting unit) can be replaced, and therefore the product warranty cost can be largely reduced.

Further, since the failure mode can be determined, before the vehicle with any failure is garaged for recovery, the accumulation data including the failure mode is transmitted to the garage. Thus, the failure mode can be previously grasped, and a component corresponding to the failed component can be prepared at an early stage. Thus, when the vehicle with any failure is garaged, the failed site can be immediately replaced. Consequently, the trouble can be solved earlier.

Further, the electricity storage unit is preferably structured by a plurality of electricity storage cells. The state detecting unit preferably detects equalizing time required to equalize storage capacity among the electricity storage cells. The accumulating unit preferably detects a total value of the equalizing time. The determining unit preferably determines, based on the total value, which one of the electricity storage unit and the state detecting unit has failed.

According to the present aspect, the equalizing time required to equalize storage capacity among the electricity storage cells is detected. The total value of the equalizing time is detected. The total value accumulated in the accumulating unit is used. Thus, it becomes possible to detect even a failure of the electricity storage cell which is difficult to detect with the voltage sensor for the electricity storage cell, and to determine that the electricity storage cell has failed.

Further, the state detecting unit preferably measures voltage of the electricity storage unit. The accumulating unit preferably accumulates a differential value between a first voltage value acquired from the electricity storage unit and a second voltage value acquired later than the first voltage value. The determining unit preferably determines, based on the accumulated differential value, which one of the electricity storage unit and the state detecting unit has failed.

According to the present aspect, the voltage of the electricity storage unit is detected. The differential value between the first voltage value acquired from the electricity storage unit and the second voltage value acquired later than the first voltage value is accumulated. Accordingly, it becomes possible to determine, based on the accumulated differential value, which one of the electricity storage unit and the state detecting unit has failed. Therefore, without the necessity of newly providing a structure for determining which one of the electricity storage unit and the state detecting unit has failed, such a determination can be easily made.

Obviously, numerous modifications and variations of the present invention are possible in light of the above teachings. It is therefore to be understood that within the scope of the appended claims, the invention may be practiced otherwise than as specifically described herein.

What is claimed is:

1. A failure determination apparatus comprising:
   an electricity storage;
   a state sensor to detect a state of the electricity storage;
   a data accumulator to accumulate data including time-series states of the electricity storage acquired by the state sensor as accumulated data; and
   a controller to determine, based on the accumulated data, whether a failure occurs in at least one of the electricity storage or the state sensor, wherein
   the electricity storage comprises a plurality of electricity storage cells,
   the state sensor detects equalizing time required to equalize storage capacity among the electricity storage cells as the data,
   the data accumulator detects a total value of the equalizing time as the accumulated data,
   the controller determines, based on the total value, whether a failure occurs in at least one of the electricity storage and the state sensor, and
   the controller determines that a failure occurs in the plurality of electricity storage cells if the total value of the equalizing time is lower than an equalization time threshold.

2. The failure determination apparatus according to claim 1, wherein the accumulation data include time stamps that are associated with the time-series states of the electricity storage, respectively.

3. A method for determining failure, comprising:
   detecting a state of an electricity storage with a state sensor;
   accumulating data including time-series states of the electricity storage as accumulated data; and
   determining, based on the accumulated data, whether a failure occurs in at least one of the electricity storage or the state sensor, wherein
   the electricity storage comprises a plurality of electricity storage cells,
   the state sensor detects equalizing time required to equalize storage capacity among the electricity storage cells,
   a total value of the equalizing time is detected, and
   it is determined that a failure occurs in the plurality of electricity storage cells if the total value of the equalizing time is lower than an equalization time threshold.

4. The method according to claim 3, wherein the accumulation data include time stamps that are associated with the time-series states of the electricity storage, respectively.

5. A failure determination apparatus comprising:
   an electricity storage;
   a state sensor to detect a state of the electricity storage;
   a data accumulator to accumulate data including time-series states of the electricity storage acquired by the state sensor as accumulated data; and
   a controller to determine, based on the accumulated data, whether a failure occurs in at least one of the electricity storage or the state sensor, wherein
   the state sensor measures voltage of the electricity storage as the data,
   the data accumulator accumulates a differential value between a first voltage value acquired from the electricity storage and a second voltage value acquired after the first voltage value is acquired, the data accumulator accumulating the differential value as the accumulated data,
   the controller determines, based on the differential value, which a failure occurs in at least one of the electricity storage and the state sensor, and
   the controller determines whether the failure occurs in at least one of the electricity storage or the state sensor if an absolute value of a change rate of the accumulated differential value is larger than a voltage differential threshold.

6. A method for determining failure, comprising:
   detecting a state of an electricity storage with a state sensor;
   accumulating data including time-series states of the electricity storage as accumulated data; and determining, based on the accumulated data, whether a failure occurs in at least one of the electricity storage or the state sensor, wherein the state sensor measures voltage of the electricity storage, a differential value between a first voltage value and a second voltage value is accumulated, the first voltage value being acquired from the electricity storage, a second voltage value being acquired later than the first voltage value, and it is determined whether the failure occurs in at least one of the electricity storage or the state sensor if an absolute value of a change rate of the accumulated differential value is larger than a voltage differential threshold.

* * * * *